(12) United States Patent  (10) Patent No.: US 8,586,132 B2
Thallner  (45) Date of Patent: Nov. 19, 2013

(54) DEVICE AND METHOD FOR COATING A MICRO- AND/OR NANO-STRUCTURED STRUCTURAL SUBSTRATE AND COATED STRUCTURAL SUBSTRATE

(76) Inventor: Erich Thallner, St. Florian (AT)

(*) Notice: Subject to any disclaimer, the term of this patent is extended or adjusted under 35 U.S.C. 154(b) by 0 days.

(21) Appl. No.: 13/367,663

(22) Filed: Feb. 7, 2012

(65) Prior Publication Data
US 2012/0135143 A1 May 31, 2012

Related U.S. Application Data

(62) Division of application No. 12/225,204, filed as application No. PCT/EP2007/002206 on Mar. 13, 2007, now abandoned.

(30) Foreign Application Priority Data

Mar. 28, 2006 (EP) .................................. 06006328

(51) Int. Cl.
*B05D 3/02* (2006.01)
*B05D 1/02* (2006.01)

(52) U.S. Cl.
USPC ....... 427/96.7; 427/425; 427/372.2; 427/240; 427/58

(58) Field of Classification Search
USPC ........................... 427/294, 248.1, 124
See application file for complete search history.

(56) References Cited

U.S. PATENT DOCUMENTS

| | | | |
|---|---|---|---|
| 4,127,436 A * | 11/1978 | Friel | 430/315 |
| 4,290,384 A | 9/1981 | Ausschnitt et al. | 118/722 |
| 4,696,885 A | 9/1987 | Vijan | 430/311 |
| 5,456,945 A * | 10/1995 | McMillan et al. | 427/252 |
| 5,527,561 A * | 6/1996 | Dobson | 427/383.3 |
| 5,670,210 A | 9/1997 | Mandal et al. | 427/240 |
| 5,711,811 A | 1/1998 | Suntola et al. | 118/711 |
| 5,824,158 A | 10/1998 | Takeuchi et al. | 118/723 |
| 5,914,439 A | 6/1999 | McGarry | 65/493 |
| 6,027,760 A | 2/2000 | Gurer et al. | 427/8 |
| 6,042,649 A * | 3/2000 | Song et al. | 118/684 |
| 6,110,531 A * | 8/2000 | Paz de Araujo et al. | 427/255.25 |
| 6,176,930 B1 | 1/2001 | Koai et al. | 118/715 |
| 6,184,131 B1 * | 2/2001 | Sugai | 438/660 |
| 6,245,150 B1 | 6/2001 | Lyons et al. | 118/726 |
| 6,258,733 B1 * | 7/2001 | Solayappan et al. | 438/785 |

(Continued)

FOREIGN PATENT DOCUMENTS

| | | | | |
|---|---|---|---|---|
| EP | 0 540 447 A1 | 5/1993 | | G03F 7/16 |
| FR | 2 597 372 | 10/1987 | | G03C 1/74 |

(Continued)

OTHER PUBLICATIONS

Notification of Reason for Refusal (dated Apr. 3, 2012) issued in connection with corresponding Japanese Patent Application No. 2007-053118, with English translation.

(Continued)

*Primary Examiner* — David Turocy

(74) *Attorney, Agent, or Firm* — Kusner & Jaffe

(57) ABSTRACT

The present invention relates to a device and a method for coating a microstructured and/or nanostructured structured substrate. According to the present invention, the coating is performed in a vacuum chamber. The pressure level in the vacuum chamber is elevated during or after the charging of the vacuum chamber with coating substance.

19 Claims, 4 Drawing Sheets

(56) References Cited

U.S. PATENT DOCUMENTS

Figure 1:
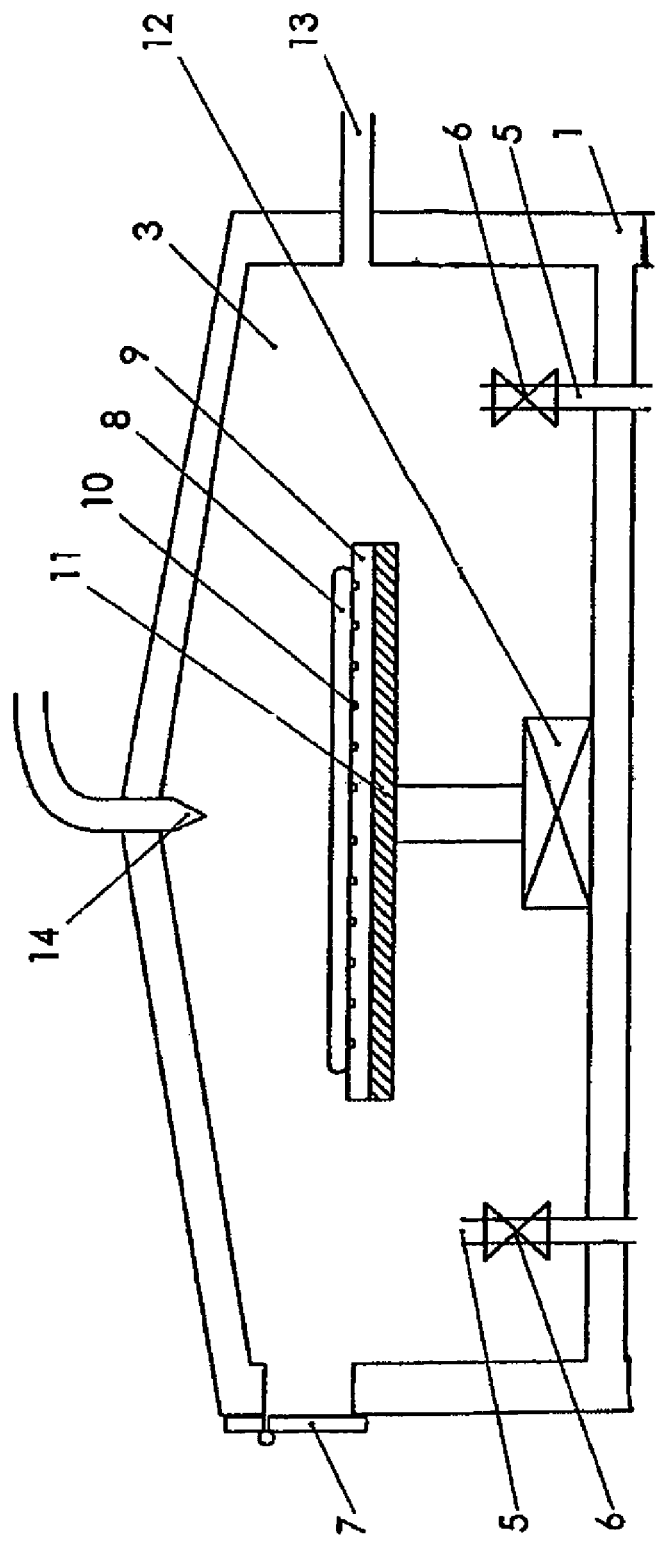

| | | | |
|---|---|---|---|
| 6,394,797 B1 | 5/2002 | Sugaya et al. | 432/253 |
| 6,471,782 B1 | 10/2002 | Fang et al. | 118/726 |
| 6,485,568 B1 | 11/2002 | Thallner | 118/300 |
| 6,514,389 B1 * | 2/2003 | Rich et al. | 204/192.1 |
| 6,933,233 B2 * | 8/2005 | Yonebayashi et al. | 438/689 |
| 7,339,791 B2 | 3/2008 | Hoover et al. | 361/711 |
| 7,968,468 B2 * | 6/2011 | Terada et al. | 438/699 |
| 2001/0001407 A1 | 5/2001 | You et al. | 156/166 |
| 2002/0176936 A1 | 11/2002 | Matsuyama | 427/240 |
| 2003/0022522 A1 * | 1/2003 | Nishiyama et al. | 438/762 |
| 2003/0207029 A1 * | 11/2003 | Rawat | 427/240 |
| 2004/0071872 A1 * | 4/2004 | Kawase | 427/240 |
| 2004/0212086 A1 * | 10/2004 | Dotta et al. | 257/737 |
| 2004/0261703 A1 | 12/2004 | Kobrin et al. | 118/715 |
| 2005/0045536 A1 * | 3/2005 | Hamada et al. | 210/97 |
| 2005/0271829 A1 | 12/2005 | Kumar et al. | 427/569 |
| 2006/0127799 A1 | 6/2006 | Kubota et al. | 430/270.1 |
| 2006/0211271 A1 * | 9/2006 | Weigel et al. | 438/788 |

FOREIGN PATENT DOCUMENTS

| | | | |
|---|---|---|---|
| JP | 55-166923 | 12/1980 | H01L 21/30 |
| JP | 5-184989 | 7/1993 | B05B 13/02 |
| JP | 5-208163 | 8/1993 | B05C 11/08 |
| JP | 05-234875 | 9/1993 | H01L 21/027 |
| JP | 6-151295 | 5/1994 | H01L 21/027 |
| JP | 07-115044 | 5/1995 | H01L 21/027 |
| JP | 07245345 A * | 9/1995 | |
| JP | 2002-527795 | 8/2002 | G03F 7/004 |
| JP | 2003-168638 | 6/2003 | H01L 21/027 |
| JP | 2004174663 | 6/2004 | B81B 1/00 |
| JP | 2004-233954 | 8/2004 | G03F 7/30 |
| WO | WO 86/02744 | 5/1986 | G03F 7/16 |
| WO | WO 00/22481 | 4/2000 | G03F 7/004 |

OTHER PUBLICATIONS

Notification of Reason for Rejection (dated Sep. 11, 2012) issued in connection with corresponding Japanese Patent Application No. 2009-501894, with English translation.

\* cited by examiner

DEVICE AND METHOD FOR COATING A MICRO- AND/OR NANO-STRUCTURED STRUCTURAL SUBSTRATE AND COATED STRUCTURAL SUBSTRATE

RELATED APPLICATIONS

The present application is a divisional of U.S. application Ser. No. 12/225,204, filed Sep. 16, 2008, now abandoned, which is a U.S. National Stage Application of International Application No. PCT/EP07/02206, filed Mar. 13, 2007, which claims priority from European Patent Application No. 06006328.6, filed Mar. 28, 2006, and U.S. patent application Ser. No. 11/390,822, filed Mar. 28, 2006, said patent applications hereby fully incorporated herein by reference.

DESCRIPTION OF THE INVENTION

The present invention relates to a device and a method for coating a microstructured and/or nanostructured structured substrate and a structures substrate coated with such a device and/or such a method.

BACKGROUND OF THE INVENTION

MEMS (micro electromechanical systems), MOEMS (microoptoelectromechanical systems), and NEMS (nanoelectromechanical systems) are a combination of mechanical and optical elements, sensors, actuators, and electronic circuits on a structured substrate. Furthermore, MEMS and NEMS may contain optical, chemical, and/or biological components. To manufacture MEMS and NEMS, it is usually necessary to provide the surface of the structured substrate, in particular a wafer, preferably made of semiconductor materials and/or moldable plastics, with a coating. Photoresist is usually used for this purpose, in order to transfer lithographic structures in a further method step.

Coating microstructured and/or nanostructured structured substrates of this type has been shown to be difficult. In contrast to the semiconductor industry, where wafers having a comparatively even surface are used, the microstructured and/or nanostructured structured substrates of the MEMS/MOEMS and NEMS are comparatively thickly structured substrates. These deep structures are generated through wet or dry etching, embossing, or molding, and may have greatly varying shapes and greatly varying depths and flank formations. The structures of the structured substrate frequently have steep flanks and often even perpendicular side walls. Currently, it is typical that depressions implemented pits and/or holes having a depth of approximately 300 µm and a width or a diameter of the upper opening of approximately 100 µm and an angle of inclination of the side walls of up to 70° are lacquered uniformly. The methods known from the semiconductor industry for surface coating, such as spin lacquering, application of photoresist films, or immersion lacquering, are not suitable, since the coating substance may not penetrate up to the floor of the depressions. Currently, it is typical to coat the structured substrate in the spraying method. For this purpose, a fine coating substance mist is applied under standard atmospheric pressure to the surface of the structured substrate using an atomizer nozzle, the spray mist being deflected using air/oxygen or nitrogen ($N_2$). The problem frequently arises in this case that the coating substance droplets close the narrow openings of the depressions because of surface tension and do not wet all of the side walls and the floor of the depressions. Furthermore, applying the spray mist through electrostatic charging, similarly to the powder coating method, to the structured substrate at standard pressure atmosphere is known. The high electrical voltage required in this case may destroy the sensitive structures and/or circuits of the structured substrate, however.

SUMMARY OF THE INVENTION

The present invention is based on the object of suggesting a device and a method for coating a microstructured and/or nanostructured structured substrate, using which a uniform coating of the structured surface of the structured substrate with a coating substance is possible.

This object is achieved according to the method by the features of the claims.

Advantageous refinements of the present invention are specified in the subclaims.

The present invention is based on the idea of situating the structured substrate on a carrier unit in a vacuum chamber. The coating substance is introduced into the vacuum chamber before and/or while and/or after the chamber is evacuated. By applying a partial vacuum to the vacuum chamber, the air is suctioned off of the surface structure, i.e., out of the depressions of the structured substrate. The pressure level in the vacuum chamber is increased, preferably suddenly, even during and/or after the introduction of the coating substance into the vacuum chamber. In this way, the coating substance is conveyed/drawn into the depressions of the structured substrate, through which even very deep and narrow depressions are coated uniformly. Photoresist is preferably used as the coating substance. However, it is also possible to coat the structured substrate with other coating substances, such as surface activation agents, solvents, adhesion promoters, or other chemicals. Treating or coating the structured substrate multiple times in sequence, preferably using different coating substances, is within the scope of the present invention.

By structured substrate is meant for example a substrate with a topography, the structured substrate consisting of a semiconductor material such as for example silicon or a composite semiconductor material. In some applications, the substrate may also be made of ceramic, glass, plastic, or carbon. The present invention is particularly advantageous for depressions in the structured substrate, such as voids (vias), in which the diameter of the opening is significantly smaller in size than the depth of the depression. Typical dimensions of such depressions range from an opening diameter of 300 µm and a depth of 700 µm to a diameter of 5 µm and a depth of 100 µm. The side wall profiles of the depressions may extend vertically downward, but may also each be inclined inwardly or outwardly by up to 45°. A typical ratio of diameter to depth of the depressions is therefore 1 to 2 to 1 to 20, more preferably 1 to 4 to 1 to 20, most preferably 1 to 8 to 1 to 20.

There are various possibilities for introducing the coating substance into the vacuum chamber. According to an especially simple variation, the coating substance is introduced into the vacuum chamber in the liquid state through an inlet line. However, misting the coating substance, for example, within the vacuum chamber, is more advantageous for achieving a uniform coating. For this purpose, spray nozzles, atomizer nozzles, and/or ultrasonic atomizers may be used. The finer the coating substance mist, the more uniform the resulting coating.

It has been shown to be advantageous to heat the structured substrate before elevating the pressure level in the vacuum chamber, particularly with the aid of heating elements of the carrier unit.

Optimum results are achieved if the structured substrate is cooled down again before and/or while the coating substance is introduced, particularly using cooling elements of the carrier unit. In this way, the condensation of coating substance mist in the depressions of the structured substrate is supported. Different temperature profiles and curves may be implemented with the aid of the heating and/or cooling elements, through which the coating result may be influenced for different structured substrates or coating substances.

Additionally or alternatively, it is conceivable to set the structured substrate in rotation, preferably using the carrier unit, while or after coating substance is introduced, in order to ensure optimum distribution of the coating substance on the surface of the structured substrate. In the process, the misting nozzle or the feed line may also be moved relative to the structured substrate. It is particularly advantageous to apply the coating substance to the structured substrate in a spiral fashion.

According to a preferred embodiment, the pressure elevation after the evacuation of the vacuum chamber is performed simultaneously with the introduction of coating substance and/or due to the introduction of coating substance.

According to the preferred embodiment, in addition to the vacuum chamber, a misting chamber is provided, which is connected via at least one connection line to the vacuum chamber. Misting means are provided within the misting chamber, particularly at least one nozzle and/or other suitable atomizer devices, for misting the coating substance. With the aid of the misting means, the coating substance is misted in the misting chamber. The pressure level in the misting chamber is higher in this case than the pressure level of the evacuated vacuum chamber. Even during or after the misting process in the misting chamber, the at least one connection line between misting chamber and vacuum chamber is opened, through which the coating substance mist flows suddenly at excess pressure from the misting chamber into the vacuum chamber, through which in turn the coating substance mist is conveyed/drawn into the depressions of the structured substrate and adheres uniformly to the side walls and the floor.

Optimum results are achieved if the coating substance or the coating substance mist is heated within the misting chamber before being introduced into the vacuum chamber.

Preferably, the at least one connection line is only opened after a desired coating substance concentration exists in the misting chamber. It is conceivable to monitor the coating substance concentration in the misting chamber, preferably through optical or chemical sensors. According to a simple embodiment, however, the misting chamber may be charged with coating substance over a predetermined time span before the connection to the vacuum chamber is produced.

In a refinement, the misting chamber is implemented having a changeable volume. The misting chamber preferably has a floor plate which is connected via a folded bellows to the remaining misting chamber. In this way, it is possible to influence the concentration of the coating substance mist within the misting chamber and influence the pressure level within the misting chamber via the change of the volume of the misting chamber.

The misting chamber advantageously also has a drain to be able to drain off excess coating substance.

It is conceivable to perform multiple coating procedures in sequence, particularly using different coating substances.

With structures designed accordingly, the introduction of the coating substance can take place without a change in pressure with respect to the surroundings, in particular at atmospheric pressure, the introduction occurring in liquid form, in particular as a liquid jet, and the coating substance having a solvent content of at least 25% by volume, in particular at least 40% by volume, preferably at least 60% by volume, most preferably at least 70% by volume. The liquid jet should preferably be applied continuously to the structured substrate in order to be able to continuously enter into the respective depressions. Hereby is achieved that no void spaces are formed in the depressions. The coating substance should preferably completely fill the depressions. Because of the high solvent content, which is later evaporated by heat exposure, an optimal, homogenous coating of the surface of the depressions and the surface of the structures substrate is achieved.

Further advantages and expedient embodiments may be inferred from the further claims, the description of the figures, and the drawing.

BRIEF DESCRIPTION OF THE DRAWINGS

FIG. 1 shows a first exemplary embodiment of a device for coating a microstructured and/or nanostructured structured substrate, in which the coating substance is misted directly in a vacuum chamber;

FIG. 2 shows a second exemplary embodiment of a device according to the present invention having a misting chamber which is connected via closable connection lines to the vacuum chamber;

FIG. 3 is an illustration of the device according to the invention in process step 1 (applying a partial vacuum);

FIG. 4 is an illustration of the device according to the invention in process step 2 (applying the coating substance);

FIG. 5 is an illustration of the device according to the invention in process step 3 (increasing the pressure level);

FIG. 6 is an illustration of a further process step, in particular the heating of the structured substrate; and FIG. 7 is an illustration of the process step of heating in a more progressed stage in comparison with the stage illustrated in FIG. 6 with parts of the depressions in the structured substrate enlarged.

DETAILED DESCRIPTION OF THE INVENTION

Identical components and components having identical function are provided with identical reference numbers in the figures.

FIG. 1 shows a device 1 for coating a microstructured and/or nanostructured structured substrate 8, a silicon wafer here. The structured substrate 8 has structuring having depressions on its surface pointing upward in the plane of the drawing, the depressions having a depth of approximately 100 μm to approximately 400 μm for MEMS. The width or the diameter of the upper openings of these depressions is in the range of 200 μm to 100 μm or less for MEMS. Therefore, in at least some of the depressions, the opening is dimensioned significantly smaller than its depth. Using the device 1 it is possible to coat the surface structure of the structured substrate 8 uniformly, particularly inside the depressions. For NEMS, the depressions have a width of 20 nm and a depth of 40 nm, for example.

The structured substrate 8 is fixed on a carrier unit 9 (chuck) in a vacuum chamber 3. Vacuum grooves 10 are provided for fixing the structured substrate 8 on the carrier unit 9. By applying a vacuum to the vacuum grooves 10, the bottom side of the structured substrate 8 is suctioned in the direction of the carrier unit 9. A closable flap 7 is provided for charging the vacuum chamber 9 with the structured substrate 8. The flap 7 may also be designed as a cap.

The carrier unit 9 has a combined heating-cooling element 11 in order to heat and cool the carrier unit 9 and therefore the structured substrate 8. With the aid of the combined heating-cooling element 11, greatly varying temperature profiles and/or curves may be implemented.

The carrier unit 9 is rotatable using a motor 12 in the fixing plane of the structured substrate 8, through which a uniform distribution of coating substance 24 may be achieved if it was not applied in atomized form.

A misting nozzle 14 is provided for charging the vacuum chamber 3 with coating substance, any type of atomizer nozzle and/or feed line being able to be provided as a nozzle. This nozzle is situated directly above the surface of the structured substrate 8 to be coated and is preferably movably/slidingly disposed above the carrier unit 9 in order to optimally distribute coating substance 24 on structured substrate 8.

To apply a partial vacuum to the vacuum chamber 3, i.e., to evacuate the vacuum chamber 3, the vacuum chamber 3 is connected via a vacuum line 13 to a vacuum system (not shown).

Furthermore, two spaced connection lines 5, each having a shutoff valve 6, are provided in the floor of the vacuum chamber 3. When shutoff valves 6 are opened, the connection lines 5 connect the vacuum chamber 3 to a higher pressure level than the pressure level of the evacuated vacuum chamber 3, preferably to the atmosphere or to an excess pressure means store.

The structured substrate 8 is coated in the following way:

A structured substrate 8 is laid on the carrier element 9 using a robot via the opened flap 7. After the structured substrate 8 is fixed and vacuum is applied to the vacuum grooves 10, the vacuum chamber 3 is closed using the flap 7. The shutoff valves 6 are also closed at this time. The structured substrate 8 is now sprayed with coating substance 24 by the misting nozzle 14, preferably a surface activation agent, a solvent, or photoresist. The coating substance 24 used is process-specific depending on the surface composition of the structured substrate 8, and the structure of the pits or holes. In the further procedure, the carrier unit 9 may now be heated using the heating-cooling element 11. Even during the heating of the carrier unit 9 and therefore the structured substrate 8, the vacuum chamber 3 is evacuated via the vacuum line 13. After a predetermined time, the carrier unit 9 is cooled down using the heating-cooling element 11. Subsequently, the shutoff valves 6 are opened, through which excess pressure flows suddenly into the vacuum chamber 3 and pushes the misted coating substance 24 into the depressions 8v of the structured substrate 8 and thus ensures uniform coating.

It is also executable/possible to charge the vacuum chamber 3 with coating substance 24 via nozzle 14 only after or even during the evacuation. The charging after the evacuation has the advantage that the coating substance 24 is not suctioned through the vacuum line 13 during the charging. The shutoff valves 6 may be opened already during or after the charging with coating substance 24. Before opening the shutoff valves 6, process-specific temperature profiles may be run through, through which a change of the consistency and/or rheological properties of the coating substance 24 is achieved.

Figure 2:
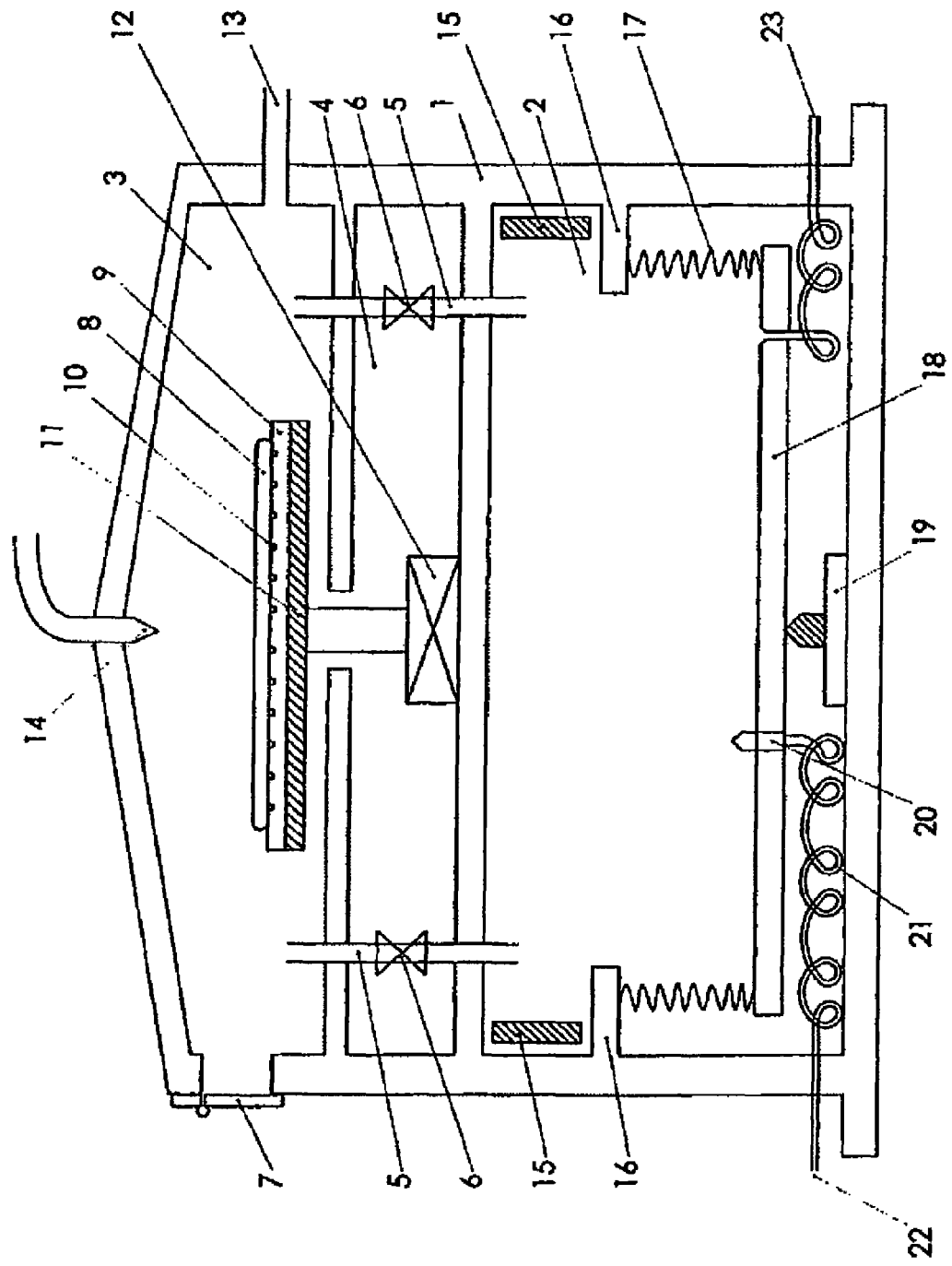
Figure 3:
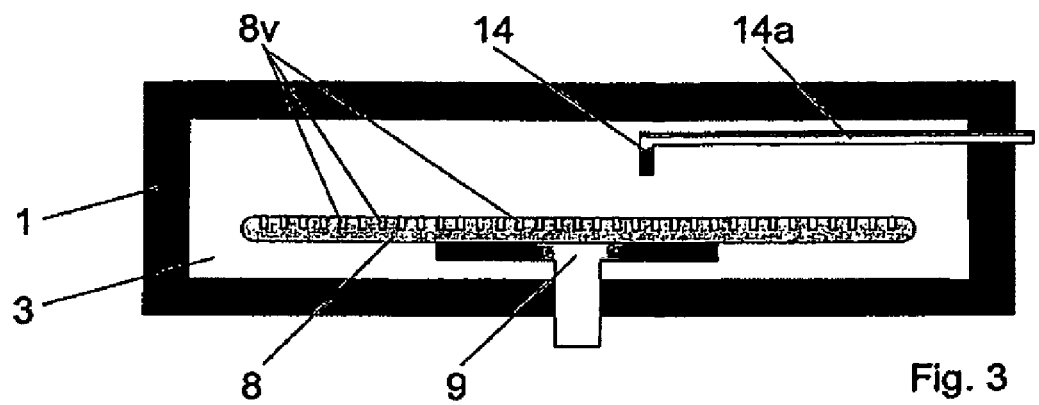

In the exemplary embodiment shown in FIG. 2, a misting chamber 2 is provided in addition to the vacuum chamber 3. The construction of the vacuum chamber 3 having carrier unit 9 essentially corresponds to the construction shown in FIG. 1. In this embodiment, the misting nozzle 14 shown in FIG. 2 may also be dispensed with, so that the charging with coating substance 24 is performed exclusively via the misting chamber 2.

An intermediate wall is inserted between the floor of the vacuum chamber 3 and the structured substrate 8, so that an intermediate chamber 4 is formed, in which the motor 12 of the carrier unit 9 is situated. The pressure level of the intermediate chamber 4 corresponds to the pressure level of the vacuum chamber 3. The intermediate chamber 4 may also be operated at atmospheric pressure. The shaft of the motor 12 is then sealed in the transition area between vacuum chamber 3 and intermediate chamber 4.

In contrast to the exemplary embodiment in FIG. 1, the connection lines 5 having their shutoff valves 6 do not connect the vacuum chamber 3 to the environment, but rather to the misting chamber 2.

Heating elements 15 are located in the upper area of the misting chamber 2 in order to be able to heat the misting chamber 2. A peripheral step 16 is located below the heating elements 15, which extends radially inward into the misting chamber 2. A floor plate 18 of the misting chamber 2 is connected via a peripherally closed folded bellows 17 to the step 16. The volume of the misting chamber 2 may be reduced or enlarged via an actuator 19, the folded bellows 17 folding together or apart during the adjustment procedure. A spray nozzle 20 is situated in the floor plate 18 for charging the misting chamber 2 with coating substance 24. Coating substance 24, preferably photoresist, solvent, or other chemicals, may be supplied to the misting chamber via a flexible connection line 21 and an adapter 22. The spray nozzle 20 is used for atomizing the coating substance 24, through which the volume of the misting chamber 2 is finable with coating substance mist.

Furthermore, an opening is provided inside the floor plate 18, which is connected to a flexible drain line 23. Via this, excess liquids, particularly coating substance 24, which accumulates in the misting chamber 2, may be removed.

The coating of structured substrates 8 in the device 1 shown in FIG. 2 is performed in the following way:

A structured substrate 8 made of semiconductor substrate or molded plastic or glass substrate, here a wafer made of silicon, is laid on the carrier unit 9 via the flap 7 and fixed using the vacuum grooves 10. The structured substrate 8 may now optionally be sprayed with a chemical substance, preferably a coating substance 24, by the nozzle 14. Preferably, the structured substrate 8 is sprayed with a surface activation substance, a solvent, or photoresist. After the optional spraying procedure, the vacuum chamber 3 is evacuated. The structured substrate 8 is first heated using the heating-cooling element 11 and then cooled again, preferably before the vacuum chamber 3 is charged with coating substance 24. During or after this, the misting chamber 2, which is preferably heated via the heating elements 15, is filled with a coating substance mist by the spray nozzle 20. The pressure level within the misting chamber 2 preferably corresponds to atmospheric pressure, but is higher than the pressure level of the evacuated vacuum chamber 3 in any case. After a sufficient filling of the misting chamber 2 with coating substance 24, whose concentration is monitored via optical or chemical sensors (not shown), the valves 6 of the connection lines 5 are opened, through which the vacuum chamber 3 suddenly fills with coating substance mist while simultaneously being supplied with pressure. Through the sudden pressure increase, in particular from vacuum to atmospheric pressure, and possibly due to different temperature profiles and/or curves of the carrier unit 9, a uniform lining of approximately 300 μm deep and approximately 100 μm wide cavities, pits, or other topographic figures which have a small opening on top in comparison to their depth, with a homogeneous protective layer, preferably a photoresist layer, is obtained.

Depending on the surface composition of the structured substrate, via the variation of the dwell time in the evacuated vacuum chamber 3 and via the flooding profile (liquid or mist) and via different temperature profiles of the carrier unit 9 and any repetition of the evacuation and charging cycles, a precisely defined coating substance deposition on all vertical, deep geometric forms of the structured substrate 8 may be achieved. Equalization of the deposition is achieved through rotation of the carrier unit 9. Possible excess liquid may also be thrown off.

In FIGS. 3 to 7, a further, possible process sequence is illustrated. In the process step depicted in FIG. 3, via a vacuum line not depicted in the graphic representation according to FIG. 3 (such as vacuum line 13 in FIG. 1), a vacuum having an absolute pressure of less than 800 mbar, in particular less than 500 mbar, preferably 100 to 400 mbar absolute pressure, is adjusted by means of a vacuum system connected to the vacuum line. Adjusting the vacuum to the predetermined pressure has the advantage that structured substrate 8 attached to carrier unit 9 by partial vacuum remains fixed on carrier unit 9 due to the lower partial vacuum in comparison to the absolute pressure present in vacuum chamber 3. A further advantage of the absolute pressure range mentioned above is that the evaporation rate or speed of the solvent comprised in coating substance 24 is not too high, but takes place in a controlled and steady manner.

Figure 4:
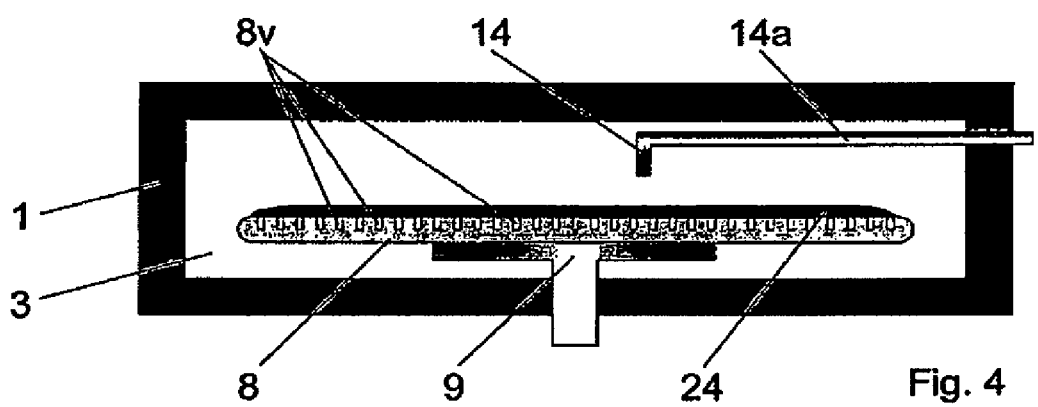
Figure 5:
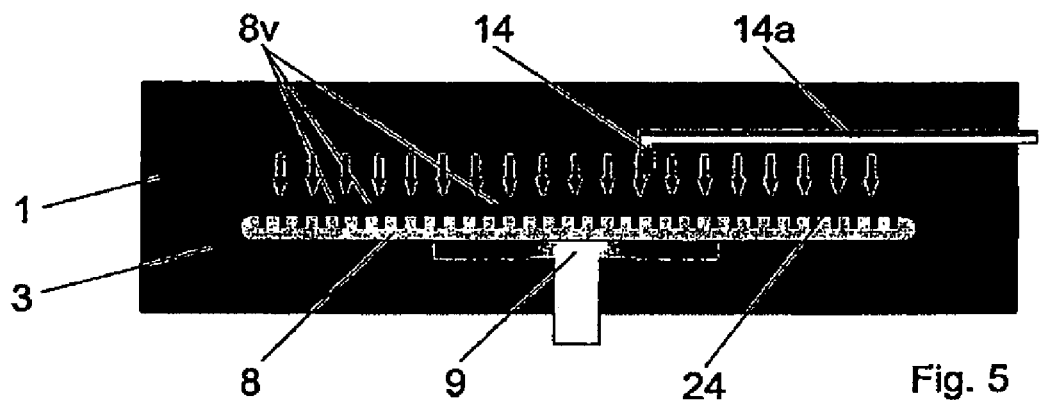
Figure 6:
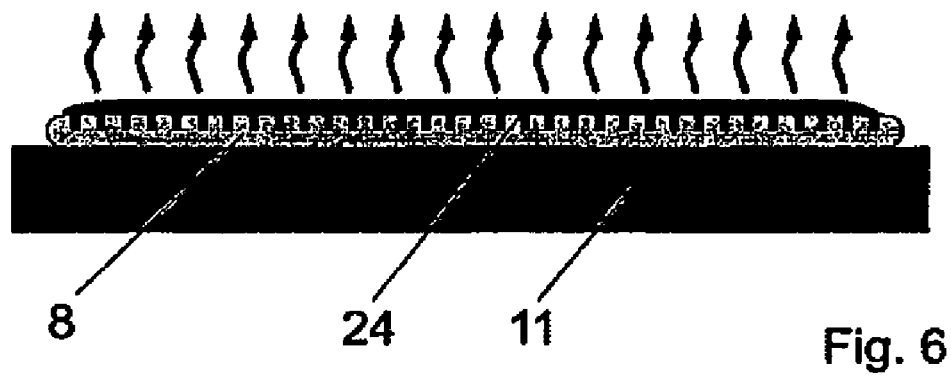
Figure 7:
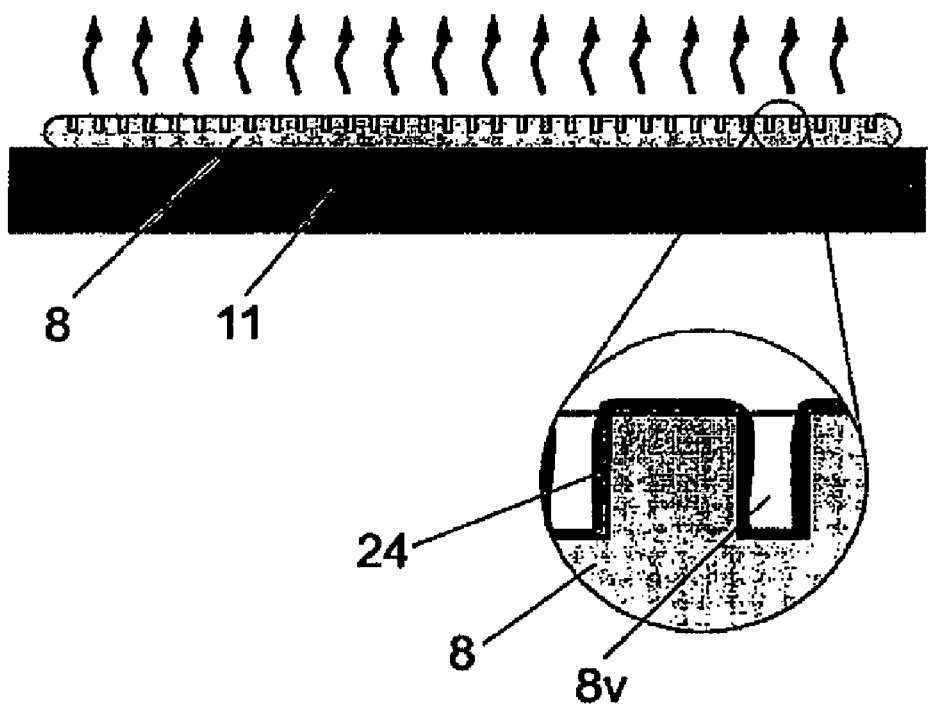

In the process step depicted in FIG. 4, coating substance 24 is applied to structured substrate 8 or distributed on same. The distribution occurs for example by rotating the structured substrate 8 at low speed of revolution, preferably between 8 and 40 revolutions per minute. While structured substrate 8 rotates, nozzle 14 is preferably moved parallel to the surface of the structured substrate and along the arm 14a of nozzle 14 by linear motion, the coating substance 24 being preferably applied in a spiral fashion by the simultaneous rotation and reciprocating motion. The coating substance volume flow discharging from nozzle 14 is chosen in such a way that the surface of the structured substrate 8 is wetted as completely as possible, i.e. preferably with a continuous coating substance layer. The volume flow discharging from nozzle 14 can also be adjusted by means of a difference in pressure between the chamber 3 and a coating substance reservoir not depicted or by means of a controlled-volume pump. The vacuum in vacuum chamber 3 draws coating substance 24 into vacuum chamber 3 and onto structured substrate 8. At this point in time, coating substance 24 normally does not (yet) flow completely into the depressions 8v of structured substrate 8 or the topography of structured substrate 8 due to the surface tension of coating substance 24.

The application of coating substance 24 to structured substrate 8 can alternatively also occur without rotation of structured substrate 8 solely by moving arm 14a of nozzle 14. A further alternative consists of disposing nozzle 14 above the center of structured substrate 8 and distributing coating substance 24 on same by rotating structured substrate 8. Dosing of the coating substance volume discharging from nozzle 14 may also occur via a controlled-volume pump and thus be adjusted more precisely.

It is also possible that coating substance 24 already at least partially enters into the topography or depressions 8v of structured substrate 8, which depends in particular on the surface tension of coating substance 24 and the geometry of depressions 8v.

After completion of the distribution step depicted in FIG. 4 and described just now, a fluid containing in particular at least in part nitrogen and/or oxygen and/or an inert gas is admitted into vacuum chamber 3. Air is preferably used as fluid. The inflow may occur because of a difference in pressure, application of external excess pressure also being possible.

Through the increase of the absolute pressure in vacuum chamber 3, coating substance 24 located on structured substrate 8 is pressed into depressions 8v or the topography of structured substrate 8 and fills same, preferably completely. This is schematically shown by means of the arrows in FIG. 5.

In a next step, structured substrate 8 is unloaded from vacuum chamber 3 and disposed above a heating plate 11. While structured substrate 8 approaches heating plate 11, which preferably occurs slowly and with defined speed, structured substrate 8 and coating substance 24 located in depressions 8v and coating substance 24 located on structured substrate 8 already heat up in a defined manner, whereby solvent and content matter of coating substance 24 to be evaporated are evaporated as slowly and defined as possible. Due to the comparatively high content of solvent in coating substance 24, the coating substance volume decreases significantly and the coating 24 depicted in FIG. 7 that is homogeneously distributed on the topography or the surface of structured substrate 8 and the surface of depressions 8v remains.

Typical heating parameters are for example 70° C. for 1 to 10 minutes at a distance of 5 mm from heating plate 11 and, subsequently, 1 to 10 minutes at a distance of 0 to 3 mm from the heating plate.

Typical coating substances 24 used in the coating system described above are: positive and negative photoresists, dielectric materials such as BCB and polyimides, protective coatings. The coating substance is usually diluted prior to coating, the dilution taking place using the following diluting agents: acetone, PGMEA, MEK, NMP, IPA, or mesitylenes, or any combination thereof.

Instead of the defined and slow approach of structured substrate 8 to heating plate 11, structured substrate 8 can also be placed directly on heating plate 11 and/or heated consecutively in a defined manner by means of different heating plates.

A combination of the individual process steps and/or device features described is also conceivable.

LIST OF REFERENCE NUMBERS 1 device
2 misting chamber
3 vacuum chamber
4 intermediate chamber
5 connection lines
6 shutoff valves
7 flap
8 structured substrate
8v depressions (vias)
9 carrier unit
10 vacuum grooves
11 heating-cooling element
12 motor
13 vacuum line
14 (misting) nozzle
14a arm
15 heating elements
16 step
17 folded bellows
18 floor plate
19 actuator
20 spray nozzle
21 flexible connection line
22 connection
23 flexible drain line
24 coating substance Having described the invention, the following is claimed:

1. A method for coating a micro structured and/or nanostructured structured substrate with depressions, the method comprising the steps of:
   providing a chamber;
   placing a structured substrate into the chamber;
   evacuating the chamber;
   introducing a coating substance from a reservoir for the coating substance into the chamber before and/or while and/or after the chamber is evacuated by means of a difference in pressure between the chamber and the reservoir for the coating substance, the coating substance having a solvent content of at least 25% by volume;
   distributing the coating substance on a surface of the structured substrate as a fluid film;
   venting the pressure in the chamber while and/or after the coating substance is introduced, thereby conveying the coating substance into the depressions; and
   thereafter evaporating the solvent such that the coating substance is homogeneously distributed on a topography of the surface of the structured substrate.

2. The method according to claim 1,
   characterized in that, after evacuating the chamber, the coating substance is introduced into the chamber in liquid form and/or is misted in the chamber.

3. The method according to claims 1 or 2,
   characterized in that the structured substrate is heated in the chamber to evaporate the solvent over a predetermined time span.

4. The method according to claims 1 or 2,
   characterized in that the structured substrate is cooled before the coating substance is introduced and after heating the structured substrate.

5. The method according to claims 1 or 2,
   characterized in that the coating substance is misted in a misting chamber, and the coating substance is introduced into the chamber by opening at least one shutoff valve and at least one connection line between misting chamber and chamber, after reaching a desired coating substance concentration in the misting chamber.

6. The method according to claim 5,
   characterized in that the pressure level in the misting chamber before the shutoff valve is opened is higher than the pressure level of the evacuated chamber, and the pressure level in the misting chamber corresponds to atmospheric pressure.

7. The method according to claim 5,
   characterized in that the misting chamber is heated before and/or while the coating substance is misted.

8. The method according to claim 1,
   characterized in that structured substrate made of semiconductor substrate or embossed or molded plastic material or glass substrate is a wafer, having depressions, pits or holes, having a depth of approximately 10 nm to approximately 400 µm, is used.

9. The method according to claim 8,
   characterized in that the width or the diameter of the depressions is less than their depth.

10. The method according to claim 1,
    characterized in that photoresist and/or surface activation agent and/or solvent and/or adhesion promoter is/are used as the coating substance.

11. The method according to claim 1,
    characterized in that the method steps after the charging of the chamber with the structured substrate are repeated multiple times, using different coating substances.

12. A method for coating a microstructured and/or nanostructured structured substrate, the method comprising the steps of:
    providing a chamber;
    placing a structured substrate into the chamber;
    introducing a coating substance into the chamber in liquid form as a liquid jet, the coating substance from a coating substance reservoir having a solvent content of at least 25% by volume by means of a difference in pressure between the chamber and the coating substance reservoir, wherein the pressure in the chamber is elevated to atmospheric pressure while and/or after the coating substance is introduced;
    distributing the coating substance on a surface of the structured substrate as a fluid film; and
    evaporating the solvent such that the coating substance is homogeneously distributed on a topography of the surface of the structured substrate.

13. A method for coating a microstructured and/or nanostructured structured substrate having the following method steps:
    charging a vacuum chamber with a structured substrate;
    evacuating the vacuum chamber;
    introducing a coating substance from a coating substance reservoir into the vacuum chamber before and/or while and/or after it is evacuated, the coating substance including a solvent;
    distributing the coating substance on a surface of the structural substrate as a fluid film;
    elevating the pressure in the vacuum chamber while the coating substance is introduced; and
    evaporating the solvent such that the coating substance is homogeneously distributed on a topography of the surface of the structured substrate.

14. The method according to claim 13,
    characterized in that, after evacuating the vacuum chamber, the coating substance is introduced into the vacuum chamber in liquid form.

15. The method according to one of claims 13 or 14,
    characterized in that the structured substrate is heated in the vacuum chamber to evaporate the solvent over a predetermined time span.

16. The method according to one of claim 13,
    characterized in that the structured substrate is cooled before the coating substance is introduced, and after heating the structured substrate.

17. The method according to one of claim 13,
    characterized in that the structured substrate is a wafer made of semiconductor substrate or embossed or molded plastic material or glass substrate having depressions, pits or holes, having a depth of approximately 10 nm to approximately 400 µm, is used.

18. The method according to one of claim 13,
    wherein introducing the coating substance into the chamber is effected in liquid form as liquid jet, and the solvent content is at least 25% by volume.

19. A method for coating a micro structured and/or nanostructured structured substrate having the following method steps:
    charging a vacuum chamber with a structured substrate;
    evacuating the vacuum chamber to an absolute pressure between 100 mbar and 400 mbar;
    introducing a coating substance from a coating substance reservoir into the vacuum chamber before and/or while and/or after it is evacuated, the coating substance having a solvent content of at least 25% by volume;

distributing the coating substance on a surface of the structural substrate as a fluid film;
elevating the pressure in the vacuum chamber while and/or after the coating substance is introduced; and
evaporating the solvent such that the coating substance is homogeneously distributed on a topography of the surface of the structured substrate.

\* \* \* \* \*

UNITED STATES PATENT AND TRADEMARK OFFICE
CERTIFICATE OF CORRECTION

| | | |
|---|---|---|
| PATENT NO. | : 8,586,132 B2 | Page 1 of 1 |
| APPLICATION NO. | : 13/367663 | |
| DATED | : November 19, 2013 | |
| INVENTOR(S) | : Erich Thallner | |

It is certified that error appears in the above-identified patent and that said Letters Patent is hereby corrected as shown below:

Title page, item (76) Inventor, replace "Erich Thallner, St. Florian (AT)" with "Erich Thallner, St. Florian (AT); Christine Thanner, Dietersburg (DE); Gerald Mittendorfer, Suben (AT)."

Signed and Sealed this
Third Day of March, 2015

Michelle K. Lee
*Deputy Director of the United States Patent and Trademark Office*